US012330697B2

(12) United States Patent
Sugigaki et al.

(10) Patent No.: US 12,330,697 B2
(45) Date of Patent: Jun. 17, 2025

(54) RAIL-GUIDED CART SYSTEM

(71) Applicant: MURATA MACHINERY, LTD., Kyoto (JP)

(72) Inventors: Akinori Sugigaki, Nuyama (JP); Tetsuya Sato, Inuyama (JP); Ken Yamashita, Kyoto (JP)

(73) Assignee: MURATA MACHINERY, LTD., Kyoto (JP)

( * ) Notice: Subject to any disclaimer, the term of this patent is extended or adjusted under 35 U.S.C. 154(b) by 200 days.

(21) Appl. No.: 17/924,705

(22) PCT Filed: Mar. 31, 2021

(86) PCT No.: PCT/JP2021/014100
§ 371 (c)(1),
(2) Date: Nov. 11, 2022

(87) PCT Pub. No.: WO2021/229948
PCT Pub. Date: Nov. 18, 2021

(65) Prior Publication Data
US 2023/0182788 A1     Jun. 15, 2023

(30) Foreign Application Priority Data
May 12, 2020   (JP) ................................. 2020-083557

(51) Int. Cl.
*B61K 9/12* (2006.01)
*B61B 3/02* (2006.01)
*H01L 21/677* (2006.01)

(52) U.S. Cl.
CPC ................. *B61K 9/12* (2013.01); *B61B 3/02* (2013.01); *H01L 21/67733* (2013.01)

(58) Field of Classification Search
CPC . B61B 3/02; B61K 9/12; G01H 1/003; G01H 1/14
See application file for complete search history.

(56) References Cited

U.S. PATENT DOCUMENTS

2016/0327454 A1   11/2016   Onda et al.
2017/0178426 A1    6/2017   Ezawa

FOREIGN PATENT DOCUMENTS

| CN | 105258785 B | 2/2018 |
| JP | 2005206306 A * | 8/2005 |
| JP | 2006-315813 A | 11/2006 |

(Continued)

OTHER PUBLICATIONS

Kizu Y (Year: 2020).*

(Continued)

*Primary Examiner* — Mark L. Greene
(74) *Attorney, Agent, or Firm* — Keating & Bennett, LLP

(57) ABSTRACT

A rail-guided cart system includes a traveling rail and a traveling cart to travel along the traveling rail. The rail-guided cart system includes a measurement sensor and a diagnosis processor. The measurement sensor is fixed with respect to the traveling rail to measure vibration or sound. The diagnosis processor diagnoses a condition of the traveling cart that passed through a measurement point on the traveling rail corresponding to a location of the measurement sensor. based on measurement data measured by the measurement sensor.

4 Claims, 8 Drawing Sheets

(56) References Cited

FOREIGN PATENT DOCUMENTS

| | | | |
|---|---|---|---|
| JP | 2008039708 A | * | 2/2008 |
| JP | 6557110 B2 | | 8/2019 |
| JP | 6689479 B1 | | 4/2020 |
| JP | 6742563 B1 | * | 8/2020 |
| WO | WO-2020255446 A1 | * | 12/2020 |

OTHER PUBLICATIONS

Tun, Jason, "Semi-Supervised Outlier Detection Algorithms," Master's dissertation. (Year: 2018).*
Official Communication issued in International Patent Application No. PCT/JP2021/014100, mailed on Jun. 22, 2021.

* cited by examiner

RAIL-GUIDED CART SYSTEM

BACKGROUND OF THE INVENTION

1. Field of the Invention

This invention relates to a configuration for diagnosing a condition of a cart in a rail-guided cart system.

2. Description of the Related Art

Conventionally, the condition of a rail-guided cart system has been diagnosed in various ways in order to take into account the possibility of failure. Japanese Patent No. 6337528 discloses a method for detecting deterioration of a traveling wheel of a traveling cart.

The traveling cart disclosed in Japanese Patent No. 6337528 is equipped with a drive wheel unit. The drive wheel unit has a traveling wheel, a reduction gear, a traveling motor, and other components. The traveling motor includes an encoder. This encoder detects a rotation speed of the traveling wheel. The output torque signal and the encoder signal are extracted from the traveling motor, and the slip speed is determined by the difference between the encoder signal and the signal from a linear sensor on the traveling cart. Concerning a space defined by the traveling torque and the slip speed (for example, a two-dimensional plane), based on the fact that the output torque and the slip speed of the traveling motor pass through a predetermined anomaly region, the deterioration of the traveling wheel is detected.

However, the technology described in Japanese Patent No. 6337528 requires an installation of encoders and linear sensors for all of the target overhead traveling vehicles in order to detect the deterioration of the traveling wheels, and there is room for improvement in this respect.

SUMMARY OF THE INVENTION

Preferred embodiments of the present invention provide rail-guided cart systems that each diagnose a condition of a rail without installing special sensors on a side of a cart.

According to an aspect of a preferred embodiment of the present invention, a rail-guided cart system a rail, a cart to travel along the rail, a measurement sensor, a diagnosis processor, a feature extractor, a learning controller, a for-training partial data extractor, and a position sensor. The measurement sensor is fixed with respect to the rail to measure at least one of vibration and sound. The diagnosis processor is configured or programmed to diagnose a condition of the cart passing through a measurement point on the rail corresponding to a location of the measurement sensor, based on the measurement data measured by the measurement sensor. The feature extractor is operable to extract a for-training feature included in for-training partial data which are partial data corresponding to data when the cart passes the measurement point, from measurement data measured by the measurement sensor. The learning controller is configured or programmed to construct a learning model for diagnosis of the condition of the cart by using a for-training data set which is a set of the for-training features based on measurement data measured by the measurement sensor for the plurality of carts. The for-training partial data extractor is operable to extract the for-training partial data from measurement data measured by the measurement sensor. The position sensor is fixed with respect to the rail to detect the cart passing through the measurement point. The partial data are extracted from the measurement data based on a timing at which the position sensor detects the cart.

This allows the condition of the cart to be diagnosed without the need for a special sensor on the side of the cart. Since the measurement sensor does not need to be installed on each of traveling carts, the cost can be reduced. The for-training partial data and the learning model can be acquired successfully.

The rail-guided cart system described above is preferably configured as follows. That is, the feature extractor is operable to extract a for-diagnosis feature contained in for-diagnosis partial data which are partial data corresponding to data when the cart passes through the measurement point, from measurement data measured by the measurement sensor. The diagnosis processor is configured or programmed to compute a machine learning evaluation value corresponding to the for-diagnosis feature extracted by the feature extractor based on the learning model trained by the learning controller.

This allows for an accurate diagnosis of the condition of the cart using the machine learning evaluation value.

The rail-guided cart system described above is preferably configured as follows. That is, the rail-guided cart system includes a for-diagnosis partial data extractor. The for-diagnosis partial data extractor is operable to extract the for-diagnosis partial data from measurement data measured by the measurement sensor.

This enables reliable acquisition of the for-diagnosis partial data.

The rail-guided cart system described above is preferably configured as follows. That is, a correlation between reference data as a basis and measurement data to be extracted is determined while the measurement data are variously offset in a time axis direction. The partial data are extracted by cutting out from the measurement data in a time range defined with reference to the reference data, with the measurement data offset in the time axis direction so that the correlation is the largest.

This allows the partial data (for-training partial data and for-diagnosis partial data) to be accurately acquired.

The rail-guided cart system described above is preferably configured as follows. That is, the rail is suspended from a ceiling of a building or from a trestle installed on a floor. The cart is an overhead transport vehicle capable of traveling along the rail.

Since the overhead transport vehicle is installed at a high location, maintenance work on it is generally difficult. However, according to this configuration, the condition of the overhead transport vehicle can be checked without having to take it down from the rail, thus alleviating the complexity of maintenance work.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
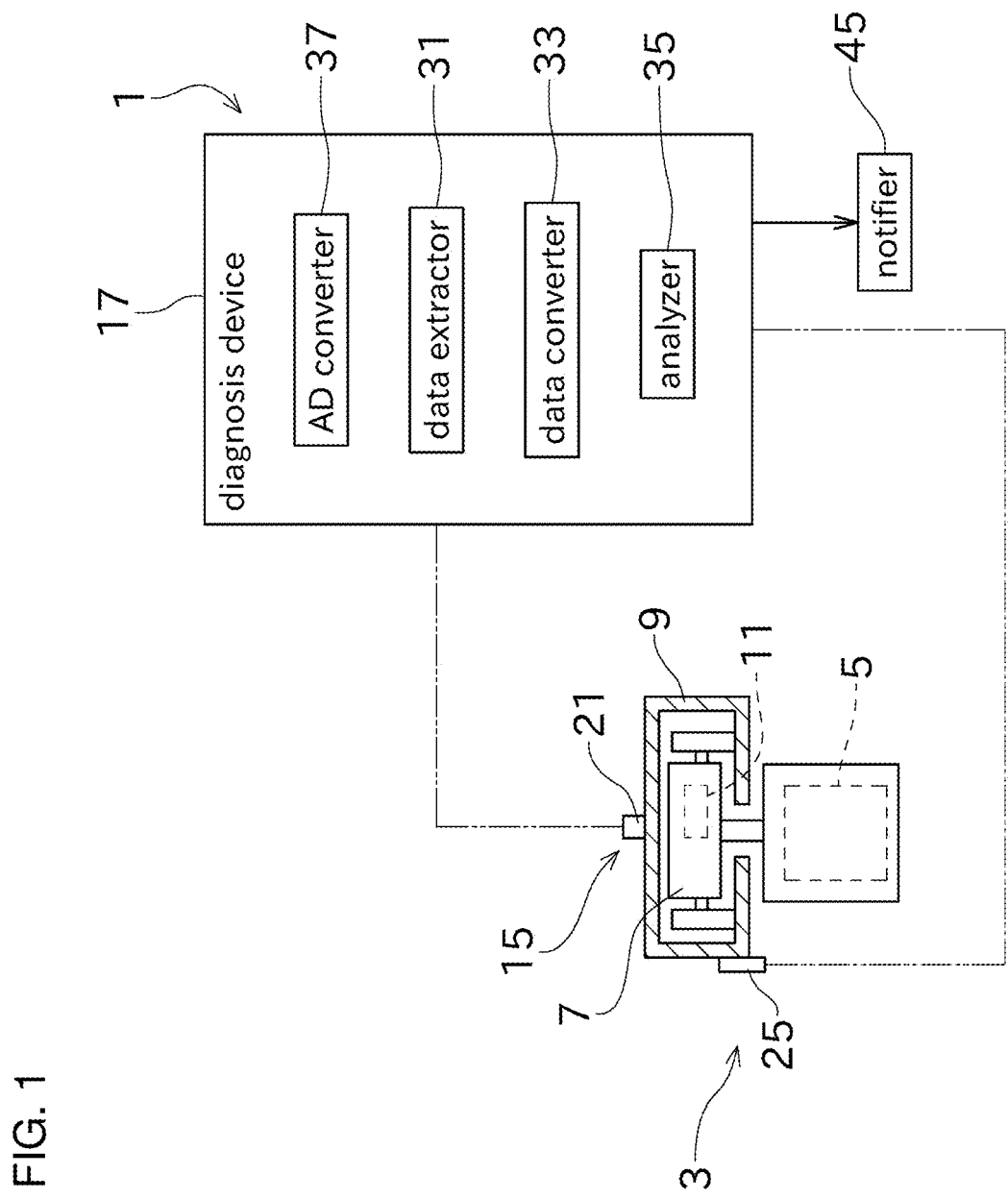
FIG. 1 is a schematic diagram of a rail-guided cart system according to a preferred embodiment of the present invention.
Figure 2:
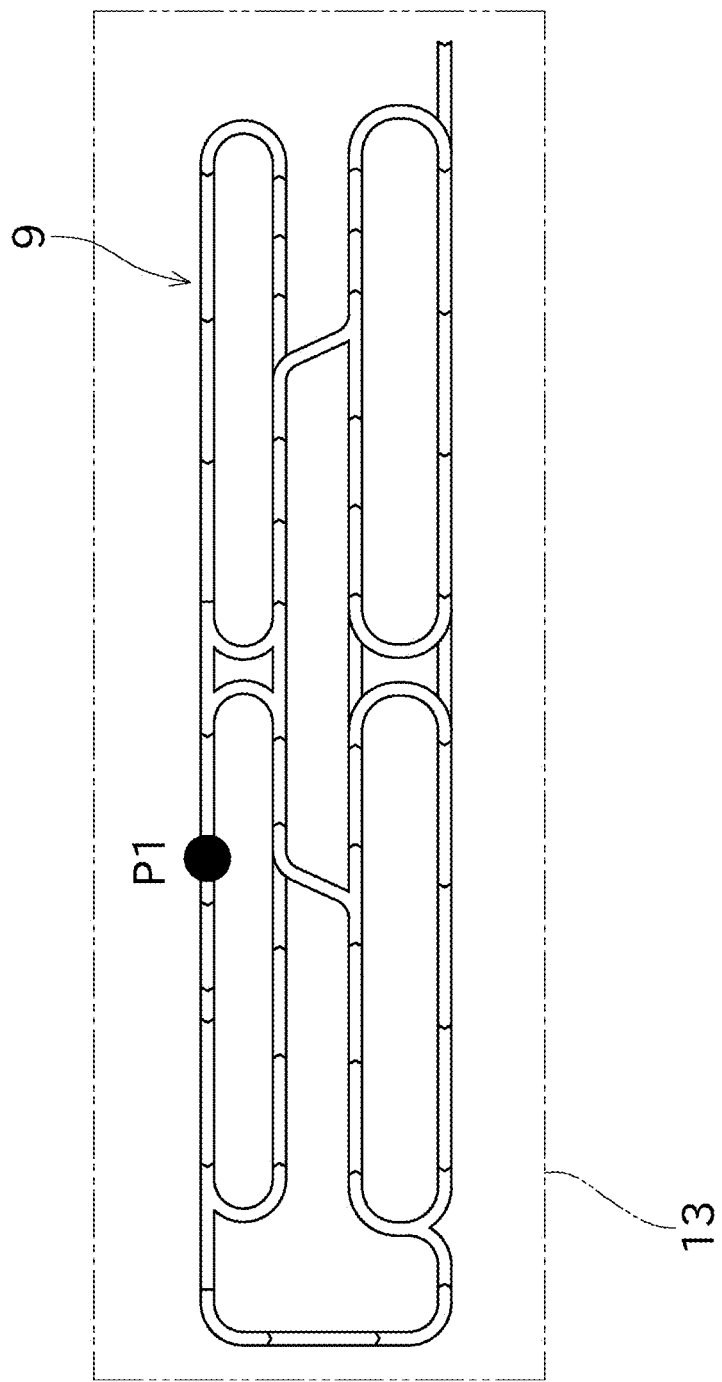
FIG. 2 is a diagram showing a traveling rail provided by the rail-guided cart system.
Figure 3:
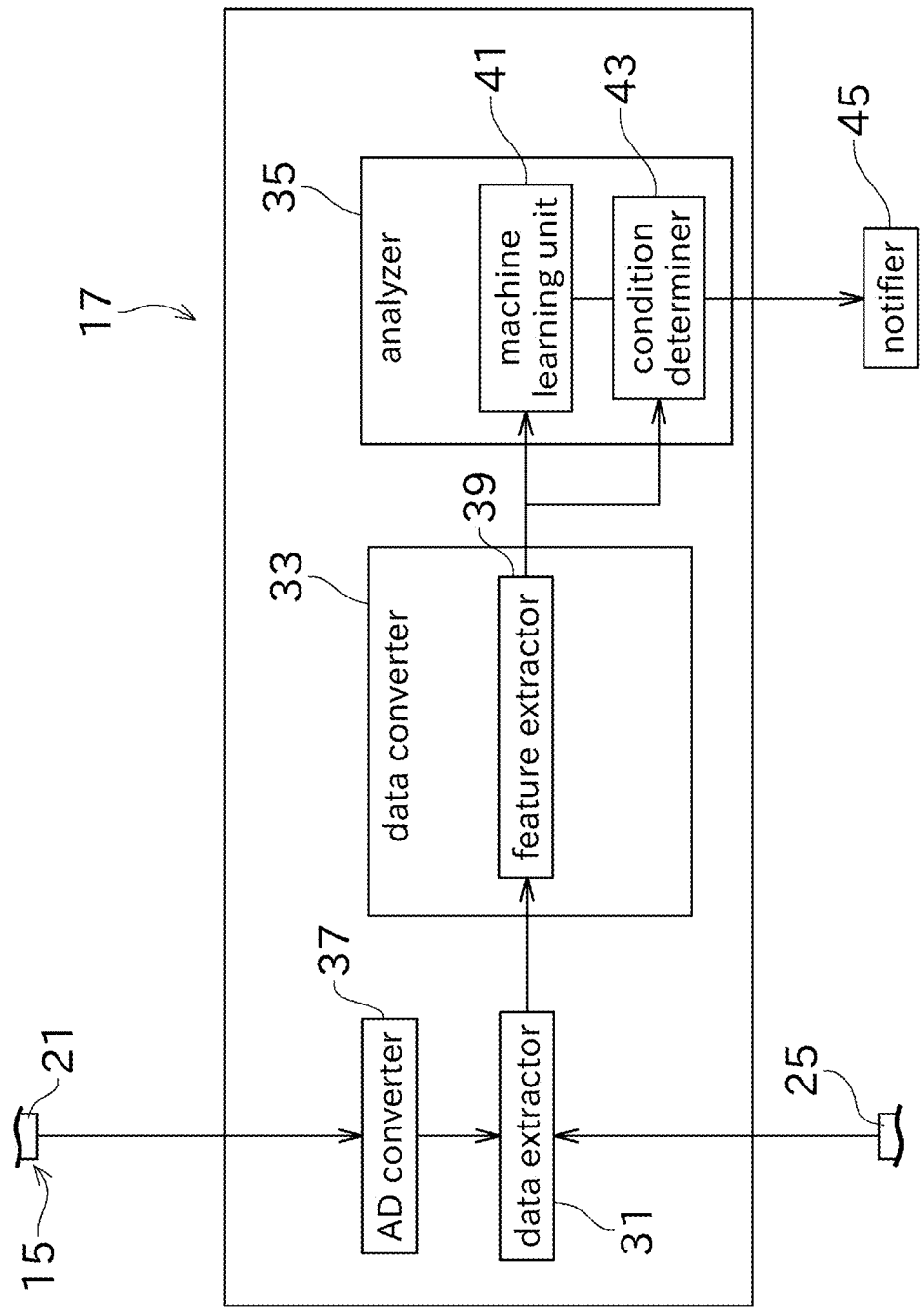
FIG. 3 is a block diagram showing a configuration of a diagnosis device.

Next, preferred embodiments of the present invention will be described with reference to the drawings. FIG. 1 is a schematic diagram of a rail-guided cart system 3 according to a preferred embodiment of the present invention. FIG. 2 is a diagram showing a traveling rail 9 provided in the rail-guided cart system 3. FIG. 3 is a block diagram showing a configuration of a diagnosis device 17.

The rail-guided cart system 3 shown in FIG. 1 is, for example, an automated transport system installed in a semiconductor manufacturing plant. The rail-guided cart system 3 can transport objects 5 such as FOUPs. The FOUP is an abbreviation for Front Opening Unified Pod.

The rail-guided cart system 3 includes a plurality of traveling carts 7 and a traveling rail (rail) 9.

The traveling carts 7 are rail-guided carts that travel along the traveling rail 9. In this preferred embodiment, an overhead transport vehicle called an OHT is used as the traveling carts 7. The OHT is an abbreviation for Overhead Hoist Transfer. However, the traveling carts 7 are not limited to this. In the rail-guided cart system 3 of this preferred embodiment, multiple traveling carts 7 with substantially identical configurations travel simultaneously. This allows for more efficient transportation.

Each traveling cart 7 includes a cart controller 11, as shown in FIG. 1. The cart controller 11 is configured as a known computer including a CPU, a ROM, a RAM, an HDD, and the like.

The cart controller 11 controls the transfer operation of the to-be-transported object 5 by the transfer mechanism, such as an articulated robot arm or hoist equipped with the traveling cart 7, the automatic traveling by the traveling mechanism (not shown), and the like. The traveling cart 7 controlled by the cart controller 11 travels along the traveling rail 9 spaced by an appropriate distance from other traveling carts 7.

As shown in FIG. 2, the traveling rail 9 is located in a building 13 of a semiconductor manufacturing plant or the like where the rail-guided cart system 3 is used. Specifically, the traveling rail 9 is preferably suspended from a ceiling of the building 13. The traveling rail 9 may be suspended from a trestle installed on a floor. The traveling rail 9 has a shape that can guide the traveling path of the traveling cart 7 shown in FIG. 1, for example. The shape of the traveling rail 9 is not limited.

The rail-guided cart system 3 is equipped with a learning system 1. As shown in FIG. 1, the learning system 1 includes a measurement device 15, a diagnosis device 17, and a notifier 45.

The measurement device 15 can measure at least one of vibration and sound generated by the traveling cart 7. In this preferred embodiment, the measurement device 15 is configured by a sensor (measurement sensor) 21. The sensor 21 detects the vibration or the sound of the traveling rail 9 when the traveling cart 7 is traveling, and outputs detection signals according to detection results of the sensor 21 to the diagnosis device 17. These detection signals correspond to measurement data measured by the sensor 21.

As mentioned above, the sensor 21 in this preferred embodiment detects the vibration or the sound of the traveling rail 9. In this preferred embodiment, the sensor 21 is installed on the traveling rail 9 side and not on the traveling cart 7. In other words, the sensor 21 is fixedly provided with respect to the traveling rail 9. When the sensor 21 is a vibration sensor that detects vibration, the sensor can be, for example, an acceleration sensor, an AE (Acoustic Emission) sensor, an ultrasonic sensor, a shock pulse sensor or the like. When the sensor 21 is a sound sensor that detects sound, the sensor includes, for example, a microphone or the like. A location where the sensor 21 is located is hereinafter referred to as measurement point P1. The measurement point P1 is defined at an appropriate location on the traveling rail 9, as shown in FIG. 2. Although not shown, a special area, called a diagnosis area, is defined in the vicinity of the measurement point P1.

The learning system 1 is provided with a position sensor 25. The position sensor 25 detects the traveling cart 7 passing through the measurement point P1. The position sensor 25 is fixedly provided with respect to the traveling rail 9.

The position sensor 25 is located near a portion of the traveling rail 9 that corresponds to the measurement point P1. The position sensor 25 is configured by a photoelectric sensor including a light emitter/receiver. When the light emitter/receiver detects that the light emitted by itself is reflected by a reflective portion of the traveling cart 7, etc., the position sensor 25 outputs a cart detection signal to the diagnosis device 17. However, the configuration of the position sensor 25 is not limited to this.

Based on the detection signals detected by the sensor 21, the diagnosis device 17 can determine a condition of the traveling cart 7 that passed through the measurement point P1 on the traveling rail 9. The diagnosis device 17 is electrically connected to each of the sensor 21 and the position sensor 25.

The diagnosis device 17 (diagnosis processor) is configured by a known computer including a CPU, a ROM, a RAM, an HDD, and the like. The diagnosis device 17 performs various processes (including diagnosis which will be described later) by executing programs stored in a memory configured by the ROM, the RAM, the HDD, and the like.

The notifier 45 includes a display such as an LCD monitor, a light, a buzzer, or the like. The notifier 45 is electrically connected to the diagnosis device 17. The notifier 45 notifies the diagnosis result of the condition of the traveling cart 7 made by the diagnosis device 17 to the operator or the like by displaying information and by notifying by sound and/or light. This enables the operator or the like to promptly know the condition of the traveling cart 7.

As shown in FIGS. 1 and 3, the diagnosis device 17 includes an AD converter 37, a data extractor 31, a data converter 33, and an analyzer 35.

The AD converter 37 converts the analog signal output by the sensor 21 into a digital signal. The AD converter 37 outputs the converted digital signal to the data extractor 31.

The data extractor 31 extracts from the detection signals output by the sensor 21 only a portion for a predetermined time range that includes a timing when the vibration or the sound of the traveling rail 9 is generated by the passage of the traveling cart 7. This time range is defined based on a timing at which the position sensor 25 outputs the cart detection signal. Hereafter, the detection signals thus extracted may be referred to as partial signals (partial data). The partial signals may be used for training or diagnosis, depending on the situation. Therefore, the data extractor 31 defines and functions as a for-training partial data extractor and a for-diagnosis partial data extractor.

The data converter 33 converts the partial signals extracted by the data extractor 31 to acquire a frequency spectrum. The data converter 33 includes a feature extractor 39.

The feature extractor 39 acquires a frequency spectrum contained in the partial signals cut out by the data extractor 31. Specifically, the feature extractor 39 performs a discrete Fourier transform process on the partial signals output by the data extractor 31. As a result, the frequency spectrum representing the partial signals as a relationship between the frequency and the intensity of the signal oscillating at that frequency is acquired. In this preferred embodiment, this frequency spectrum is used as a feature (for-training feature or for-diagnosis feature).

The analyzer 35 constructs a learning model by machine learning a number of frequency spectra input from data converter 33. In this preferred embodiment, the learning model is a function that inputs a frequency spectrum and outputs an evaluation value. Once the learning model is constructed, the analyzer 35 uses this learning model to compute the evaluation value, from the frequency spectrum input from data converter 33 for any traveling cart 7. Since this evaluation value is the result of machine learning, it can be called a machine learning evaluation value. The evaluation value acquired from the learning model is used to diagnose the condition of the traveling cart 7.

The analyzer 35 includes a machine learning unit (learning controller) 41 and a condition determiner (diagnosis unit) 43.

The machine learning unit 41 constructs the learning model for the diagnosis of the condition of the traveling cart 7 using the frequency spectra of the partial signals corresponding to the plurality of traveling carts 7 as a set of training data. In this preferred embodiment, a one-class SVM which is known us used as the learning model. SVM is an abbreviation for Support Vector Machine. In this preferred embodiment, an outlier detection (in other words, anomaly detection) is performed by unsupervised learning of a one-class SVM.

Figure 4:
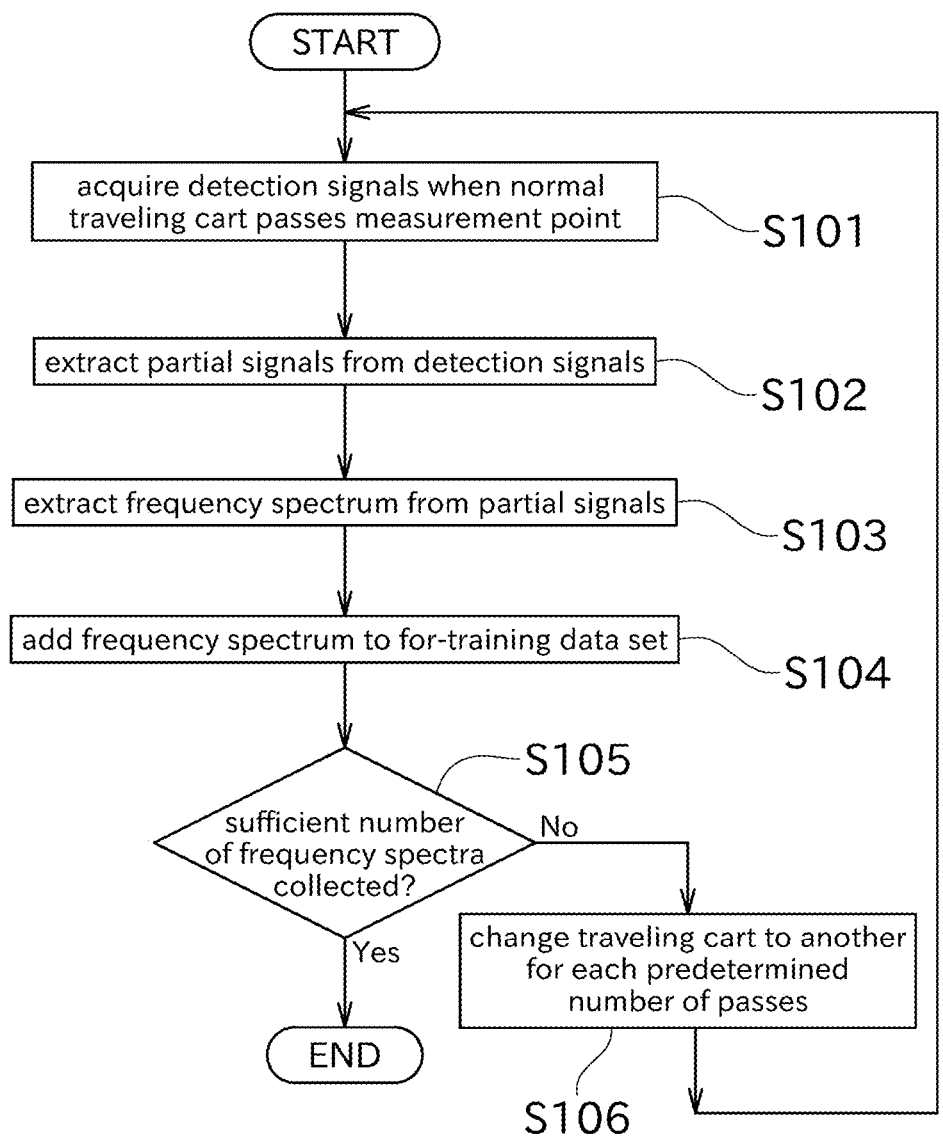
FIG. 4 is a flowchart of a process performed by the rail-guided cart system to acquire a data set for training.
Figure 5:
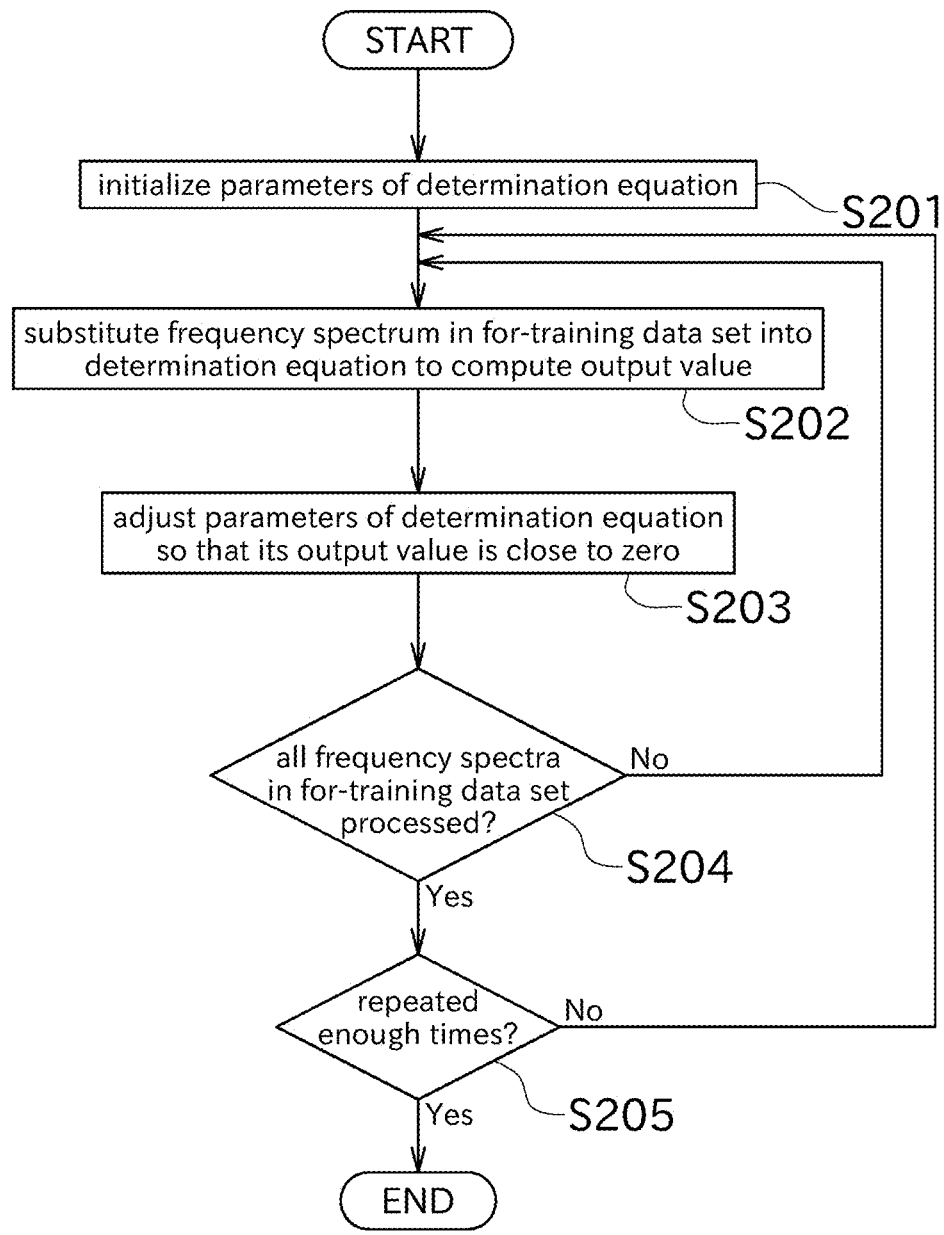
FIG. 5 is a flowchart of a process of performing machine learning.

The construction of the learning model will be described below in detail. FIGS. 4 and 5 show flowcharts of processes in the learning system 1 for the machine learning unit 41 to construct the learning model.

First, the learning system 1 collects data for the machine learning unit 41 to construct the learning model by the process shown in FIG. 4.

First, for a traveling cart 7 traveling along the traveling rail 9, detection signals about vibration or sound caused by traveling are acquired by the sensor 21 (step S101). Here, any traveling cart 7 that passes through the measurement point on the traveling rail 9 is a normal traveling cart 7. Hereafter, the data acquired by measuring a normal traveling cart 7 may be referred to as normal data.

Next, the data extractor 31 of the diagnosis device 17 extracts signals partially from the detection signals acquired by the sensor 21 (step S102). Thus, the partial signals described above are acquired. The time range in which the partial signal is cut out from the detection signal is, referring to the timing when the position sensor 25 detects that the traveling cart 7 passes through the measurement point P1, from a predetermined time before the reference timing to a predetermined time after the reference timing.

Next, in the data converter 33 of the diagnosis device 17, the feature extractor 39 executes a discrete Fourier transform process on the partial signals from the data extractor 31 and extracts a frequency spectrum (step S103). In this preferred embodiment, the feature input to the learning model is this frequency spectrum. Strictly speaking, the feature is the signal strength of each frequency component in the frequency spectrum. Smoothing is performed on the frequency spectrum as appropriate. There are various methods of smoothing, for example, a convolution integral of a Gaussian filter.

Next, the memory (not shown) of the diagnosis device 17 stores the frequency spectrum acquired by the feature extractor 39 as for-training data that constitutes a for-training data set (step S104).

The process from step S101 to step S104 is repeatedly performed until the traveling cart 7 passes through the measurement point P1 enough times and a large number (for example, thousands) of frequency spectra are acquired (step S105). In order to acquire frequency spectra under identical conditions, a traveling speed at which the traveling cart 7 passes through the measurement point P1 for data collection is controlled to be constant at a predetermined speed for data acquisition.

The measurement point P1 set on the traveling rail 9 can be passed by not only one but also multiple traveling carts 7. In this preferred embodiment, for example, when about several hundred frequency spectra have been acquired per one normal traveling cart 7, it is replaced with a normal traveling cart 7 which is a different device from above (step S106), the collection process of a similar number of frequency spectra is carried out.

The above process results in the for-training data set. In this preferred embodiment, the for-training data set is essentially a collection of a large number of the frequency spectra. This for-training data set is stored in the memory of the diagnosis device 17. The for-training data set stored in this memory can be changed (updated) as needed.

Because of the cart changeover operation in step S106, the for-training data set acquired in the process of FIG. 4 includes the frequency spectra obtained from multiple traveling carts 7 (multiple traveling carts 7 different from each other). By using such a for-training data set to perform machine learning, it is possible to reduce or prevent overtraining in relation to individual features specific to one traveling cart 7. The number of traveling carts 7 from which the frequency spectra are collected is arbitrary as long as it is greater than or equal to two, but it is preferable to use a certain large number so that the individual differences among the traveling carts 7 will not be emphasized.

This for-training data set does not include frequency spectra acquired from abnormal traveling carts 7, and all frequency spectra are acquired from normal traveling carts 7.

The learning system 1 then uses the acquired for-training data set to perform machine learning by the machine learning unit 41 using the process shown in FIG. 5. The process in FIG. 5 corresponds to a training phase of machine learning.

First, in the analyzer 35 of the diagnosis device 17, the machine learning unit 41 initializes parameters of a determination equation to determine the abnormality of the traveling cart 7 as appropriate (step S201). In this preferred embodiment, the determination equation is expressed as follows.

$$f(x) = \sum_{i=1}^{N} \alpha_i K(x_i, x) - \rho$$

$$K(x_i, x) = \exp\left(-\frac{1}{2\sigma}\|x_i - x\|^2\right)$$

In the above formula, f(x) is the determination equation and corresponds to the learning model of this preferred embodiment. The input to the determination equation f, i.e., x, is an N-dimensional vector representing the frequency spectrum to be input. In this preferred embodiment, N means the number of frequency components when the frequency spectrum is expressed in terms of the signal strength of each of the multiple frequency components. The output of the determination equation f is a scalar value called the evaluation value, details of which will be described later.

K(xi, x) is a known kernel function of a one-class SVM. The kernel function is a mapping function to a higher-dimensional space such that the output becomes closer to the origin as the frequency spectrum becomes an outlier. In a one-class SVM, a hyperplane with the maximum distance from the origin is defined in this mapping to the higher-dimensional space. This hyperplane is a criterion for determining outliers. In this preferred embodiment, a Gaussian kernel is used as the kernel function, but the kernel function is not limited to this.

αi, xi, and ρ are the parameters subject to machine learning. In this preferred embodiment, constructing a learning model corresponds to acquiring the optimal values of αi, xi, and ρ to determine the determination equation. In step S201, these parameters are initialized. The values used for initialization (initial values of the parameters) can be, for example, random values. A parameter other than the above, i.e., σ, is called hyperparameter and is determined as appropriate by the designer.

Next, the machine learning unit 41 picks up one frequency spectrum contained in the for-training data set, to substitute in the form of an N-dimensional vector x into the determination equation f to acquire the value f(x) (step S202). Then, αi, xi, and ρ are adjusted so that the acquired value f(x) is close to 0 (step S203). The process of step S202 and step S203 is repeated for all frequency spectra of the for-training data set (step S204). In this way, the training is completed for one epoch. The epoch indicates that the for-training data contained in the for-training data set is trained once.

The process from step S202 to step S204 is further repeated an appropriate number of times (step S205). This results in training for multiple epochs. Training is repeated an appropriate number of times for one for-training data set, therefore, the learning model with good performance can be realized.

The values of the parameters αi, xi, and ρ are acquired by the process of FIG. 5 and the values of the parameters are stored in the memory of the diagnosis device 17. The above-mentioned determination equation f, to which the values of the parameters αi, xi, and ρ are assigned, represents a learned model. Therefore, substantially speaking, the acquired values of the parameters αi, xi, and ρ themselves can be considered to be the learned model.

In outlier detection using the one-class SVM, if the value of f(x) is 0 or positive, it indicates that x is not an outlier. If the value of f(x) is negative, it indicates that x is an outlier, and the smaller the value of f(x), the greater the degree of value outlier. The condition determiner 43 of this preferred embodiment diagnoses whether the condition of the traveling cart 7 is normal/abnormal, using the fact that the frequency spectrum when an abnormality occurs in the traveling cart 7 is an outlier in relation to the frequency spectrum when it is normal.

Figure 6:
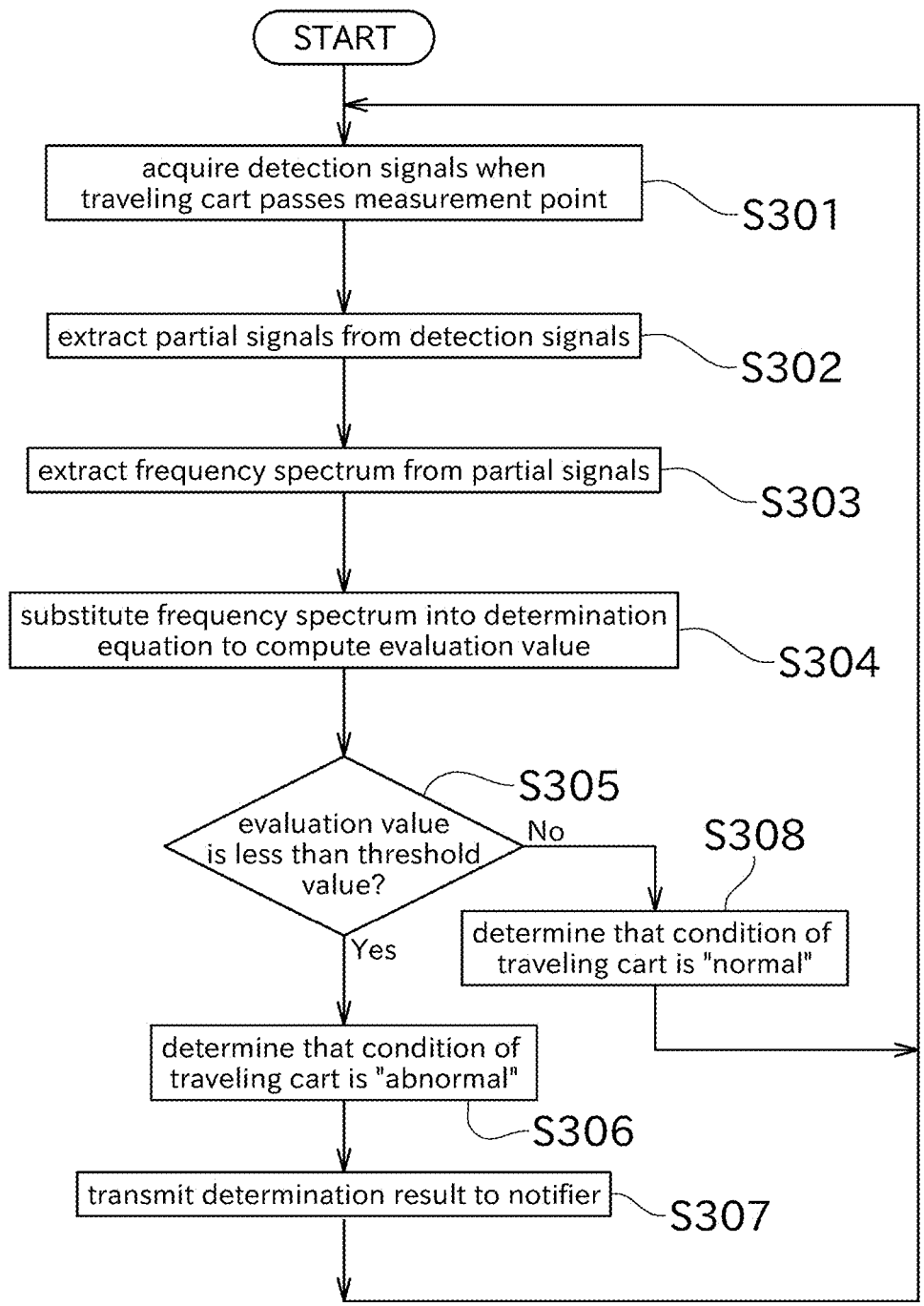
FIG. 6 is a flowchart of a process performed in the rail-guided cart system for a condition determiner to make a determination.

In the actual diagnosis, the process shown in FIG. 6 is performed. The process in FIG. 6 corresponds to an inference phase of machine learning.

First, the vibration or sound caused by traveling of the traveling cart 7 is acquired by the sensor 21 (step S301). At this time, the traveling cart 7 is controlled to pass through the measurement point P1 at the same speed as the speed for data acquisition described above. Partial signals are cut out from these detection signals (step S302). Hereafter, these partial signals may be referred to as for-diagnosis partial signals. Furthermore, a frequency spectrum is extracted from these for-diagnosis partial signals (step S303).

The process of step S301 to step S303 is substantially the same as that of step S101 to step S103 in FIG. 4. However, in the case of FIG. 6, it is not known whether or not the traveling cart 7 passing through the measurement point P1 has an abnormality.

Next, the condition determiner 43 inputs the frequency spectrum acquired in step S303 into the determination equation and computes an evaluation value (step S304). At this time, the parameters acquired by the process in FIG. 5 are used as the parameters αi, xi, and ρ of the determination equation. Therefore, the determination equation used in step S304 is synonymous with the trained learning model.

Figure 7:
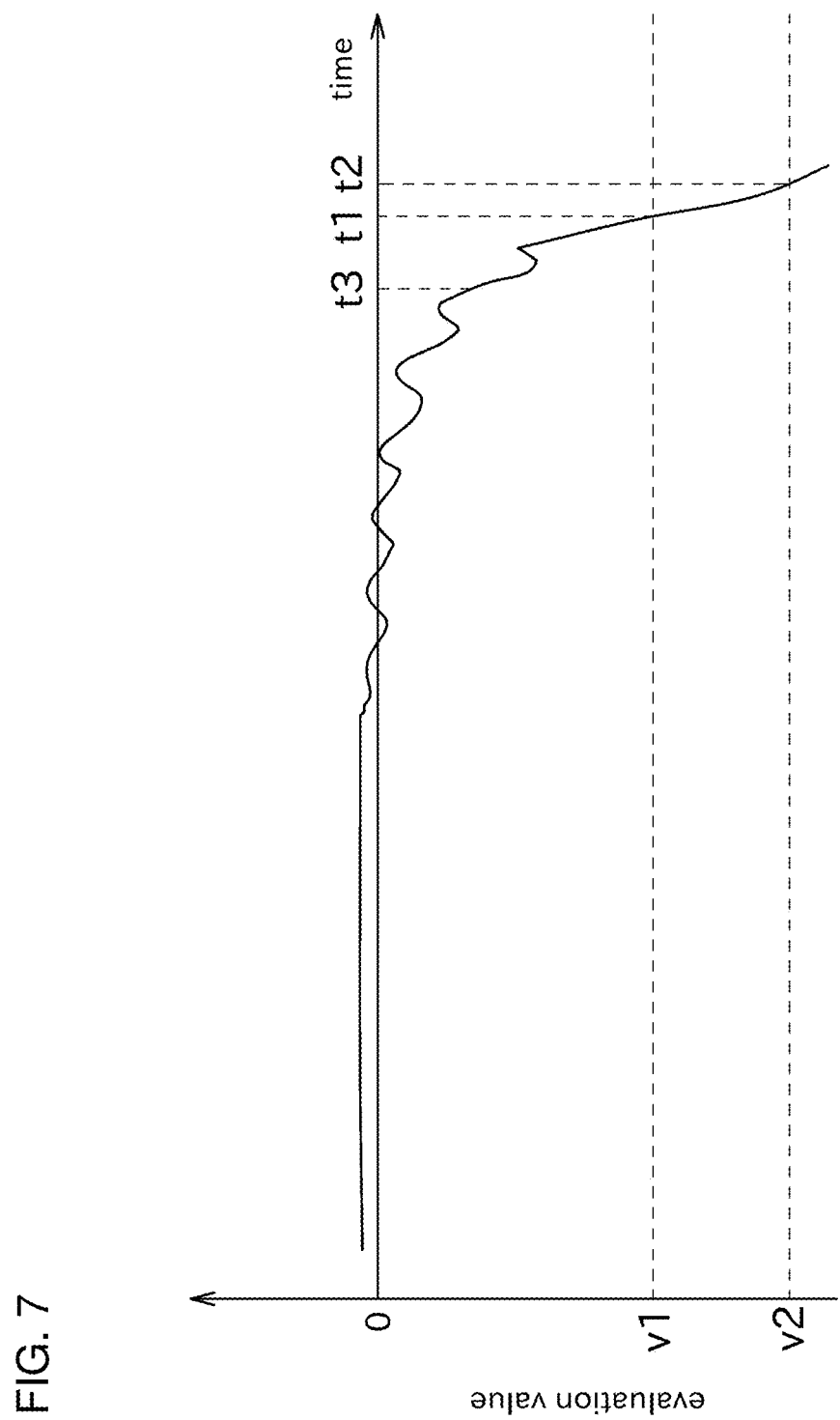
FIG. 7 is a graph showing a relationship between the operating hours of the traveling cart and an evaluation value.

Next, the condition determiner 43 determines whether the computed evaluation value is less than a threshold value v1 (step S305). FIG. 7 is a graph showing changes in the evaluation value when the same traveling cart 7 is kept in operation. This graph can be obtained by having the learning model (determination equation) complete the training phase of FIG. 5 and then actually performing a durability test of the traveling cart 7, etc.

In this preferred embodiment, the threshold value v1 is set to a value at which it is assumed that the traveling cart 7 will soon fail, as shown in the graph in FIG. 7.

Specifically, the graph in FIG. 7 shows that the traveling cart 7 will fail and become inoperable at timing of t2. In this case, it is preferable to generate some warning at, for example, timing of t1 which is a little before t2. Therefore, the threshold value v1, which is used as a boundary to determine between normal and abnormal conditions, is set to a value with some margin for the evaluation value corresponding to a condition in which a clear failure appears in the traveling cart 7 (hereinafter referred to as in-failure evaluation value v2). The threshold value v1 and the in-failure evaluation value v2 are negative values. The in-failure evaluation value v2 can be defined with reference to the results of the durability test described above. The threshold value v1 is larger than the in-failure evaluation value v2 by the margin described above. The size of this margin is defined in consideration of the importance of the continued operation of the rail-guided cart system 3, the cost of replacing parts, etc.

If the evaluation value is less than or equal to the threshold value v1 in the determination of step S305, the condition determiner 43 determines that the condition of the traveling cart 7 is abnormal (step S306). In this case, the condition determiner 43 transmits the determination result (that the condition of the traveling cart 7 is abnormal) to the notifier 45 (step S307). As a result, the notifier 45 notifies, for example, one or both of that "the condition of the traveling cart 7 is abnormal" and that "a traveling cart for replacing or parts need to be prepared for the traveling cart 7". The length of remaining uptime is a length of time until the evaluation value is expected to fall below the in-failure evaluation value v2. The length of remaining uptime can be estimated, for example, by the graph in FIG. 7 and the current evaluation value.

If the evaluation value is greater than or equal to the threshold value v1 in the determination of step S305, the condition determiner 43 determines that the condition of the traveling cart 7 is normal (step S308).

Regardless of whether the determination result is normal/abnormal, the process returns to step S301 and the diagnosis is performed again as the traveling cart 7 passes.

The notification by the notifier 45 preferably includes information that parts of the traveling cart 7 or a traveling cart for replacing will need to be prepared. In this case, the appropriate preparation can be urged to the operator or the like.

As explained above, the rail-guided cart system 3 of this preferred embodiment includes the traveling rail 9 and the traveling cart 7 that travels along the traveling rail 9. The rail-guided cart system 3 includes the sensor 21 and the diagnosis device 17. The sensor 21 is fixedly provided with respect to the traveling rail 9 and measures vibration or sound. The diagnosis device 17 diagnoses the condition of the traveling cart 7 that passed through the measurement point P1 on the traveling rail 9 corresponding to the location of the sensor 21, based on the measurement data measured by the sensor 21.

This allows the condition of the traveling cart 7 to be diagnosed without the need for a special sensor on the side of the traveling cart 7. Since the sensor 21 does not need to be installed on each of traveling carts 7, the cost can be reduced.

The rail-guided cart system 3 of this preferred embodiment includes the feature extractor 39 and the machine learning unit 41. The feature extractor 39 extracts the frequency spectrum contained in the for-training partial signals which are partial signals corresponding to the detection signals when the traveling cart 7 passes through the measurement point P1, from the detection signals detected by the sensor 21. The machine learning unit 41 constructs the learning model for the diagnosis of the condition of the traveling cart 7 by using a for-training data set which is a set of the frequency spectra based on the detection signals measured by the sensor 21 for a plurality of traveling carts 7.

This allows for a good learning model to be realized.

The rail-guided cart system 3 of this preferred embodiment includes the data extractor 31. The data extractor 31 extracts the for-training partial signals from the detection signals detected by the sensor 21.

This allows the for-training partial signals to be acquired successfully.

In the rail-guided cart system 3 of this preferred embodiment, the feature extractor 39 extracts the frequency spectrum included in the for-diagnosis partial signals which are partial signals corresponding to the detection signals when the traveling cart 7 passes through the measurement point P1, from the detection signals detected by the sensor 21. The diagnosis device 17 computes an evaluation value corresponding to the frequency spectrum extracted by the feature extractor 39 based on the learning model trained by the machine learning unit 41.

This allows for a accurate diagnosis of the condition of the traveling cart 7 using the evaluation value.

The rail-guided cart system 3 includes the data extractor 31. The data extractor 31 extracts the for-diagnosis partial signals from the detection signals detected by the sensor 21.

This allows for reliable acquisition of the for-diagnosis partial signals.

The rail-guided cart system 3 of this preferred embodiment includes a position sensor 25. The position sensor 25 is fixedly provided with respect to the traveling rail 9 and detects the traveling cart 7 passing through the measurement point P1. The data extractor 31 extracts partial signals (for-training partial signals and for-diagnosis partial signals) based on the timing at which the position sensor 25 detects the traveling cart 7.

This allows for better acquisition of the partial signals.

In the rail-guided cart system 3 of this preferred embodiment, the traveling rail 9 is provided suspended from the ceiling of the building 13, for example. The traveling cart 7 is the overhead transport vehicle that travels along the traveling rail 9, for example.

Since the overhead transport vehicle is installed at a high location, maintenance work on it is generally complicated. However, according to this preferred embodiment, the condition of the traveling cart 7 as an overhead transport vehicle can be checked without having to take it down from the traveling rail 9, thus alleviating the complexity of maintenance work.

Next, a modification regarding extraction by the data extractor 31 will be described.

In the above preferred embodiment, the range in which the partial signals are cut out from the detection signals is defined based on the timing at which the position sensor 25 outputs the cart detection signal. However, in this configuration, due to individual differences in the mounting positions of the wheels of the traveling cart 7 for example, a discrepancy may occur in the timing at which vibration or sound is generated on the traveling rail 9 when the traveling cart 7 passes through the measurement point P1. This may reduce the accuracy of the discrimination result. Therefore, in this modification, a correction is made to adjust the detection signal to be extracted in the direction of the time axis.

In the learning system 1 of the modification, before collecting data for the for-training data set, reference signals (reference data) that serve as a basis to define the range of data extracted by the data extractor 31 are stored in the diagnosis device 17 in advance. These reference signals can be acquired based on the output of the AD converter 37 when the traveling cart 7 passes through the measurement point P1. A traveling cart 7 in normal condition is used as the traveling cart 7 at this time, and the traveling cart 7 passes through the measurement point P1 at the speed for data acquisition described above.

Figure 8:
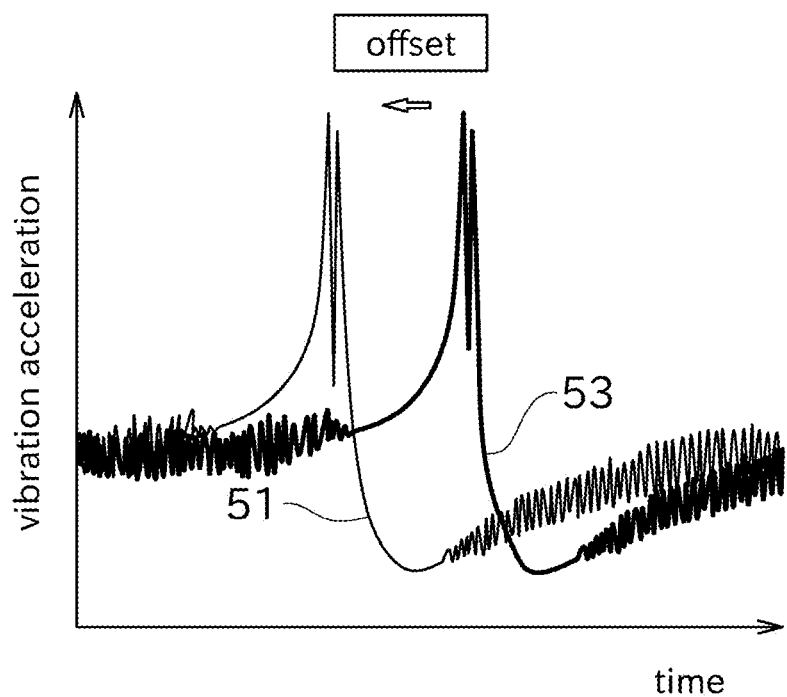
FIG. 8 is a graph explaining an offset process of detection signals.

Then, the process of FIG. 4 starts. The graph in FIG. 8 shows an example of the relationship between the waveform of the detection signals acquired in step S101 and the waveform of the reference signals when the sensor 21 is a vibration sensor. In FIG. 8, the detection signals are represented in a simplified form for convenience. The data extractor 31 computes a correlation of the acquired detection signals 53 with the reference signals 51 while variously offsetting the detection signals 53 in a time axis direction, and searches for the direction and amount of offset that maximizes the correlation. The data extractor 31 offsets the detection signals 53 in the time axis direction so that the correlation of the detection signals 53 to the reference signals 51 is the largest.

In this modification, the time range in which the data extractor 31 extracts the detection signals is defined not with respect to the timing at which the position sensor 25 outputs the cart detection signal, but the reference signals. The data extractor 31 cuts out the detection signals according to this time range to acquire the partial signals.

Offsetting of the detection signal is not only performed in the process of FIG. 4, but also in the process of FIG. 6. In this modification, the process of eliminating the timing discrepancy of the waveforms acquired by the sensor 21 can improve the accuracy of the diagnosis by the learning model.

As described above, in the rail-guided cart system 3 of this modification, the data extractor 31 determines the correlation between the reference signals 51 and the detection signals 53 to be extracted, while variously offsetting the detection signals 53 in the time axis direction. The data extractor 31 cuts out the partial signals from the detection signals 53 according to the time range defined with reference to the reference signals 51, in a state where the detection signals 53 are offset in the time axis direction so that the correlation is the largest.

This allows the partial signals to be acquired in a manner that eliminates timing discrepancies.

While some preferred embodiments of the present invention have been described above, the foregoing configurations may be modified, for example, as follows.

In the above preferred embodiments, the machine learning unit 41 and the condition determiner 43 are provided in one diagnosis device 17, however, they may be provided in different devices. For example, only the machine learning unit 41 in FIG. 3 can be taken out and made into a different device from the diagnosis device 17. Hereafter, the computer with the machine learning unit 41, which is different from the diagnosis device 17, is referred to as training device. In this example, the location where the learning model is constructed is to be different from the location where the diagnosis of the condition of the traveling cart 7 is performed. The for-training data set acquired by the data collection at the diagnosis device 17 is provided to the training device. The data of the learning model constructed in the training device (in effect, the parameters of the determination equation described above) are provided to the diagnosis device 17. The provision of data between devices can be done, for example, by known communication.

When the evaluation value continues to have a large decrease per unit of time (for example, at timing of t3 in FIG. 7), the condition determiner 43 can determine that the traveling cart 7 is approaching abnormality. The result of this determination can be notified using the notifier 45 in the same way as when the evaluation value becomes less than the threshold value v1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A rail-guided cart system comprising:
a rail;
a cart to travel along the rail;
a measurement sensor fixed with respect to the rail to measure at least one of vibration and sound;
a diagnosis processor configured or programmed to diagnose a condition of the cart passing through a measurement point on the rail corresponding to a location of the measurement sensor, based on measurement data measured by the measurement sensor;
a feature extractor to extract a for-training feature included in for-training partial data which are partial data corresponding to data when the cart passes through the measurement point, from measurement data measured by the measurement sensor;
a learning controller configured or programmed to construct a learning model for diagnosis of the condition of the cart by using a for-training data set which is a set of the for-training features based on measurement data measured by the measurement sensor for a plurality of carts containing no abnormality;
a for-training partial data extractor to extract the for-training partial data from measurement data measured by the measurement sensor; and
a position sensor fixed with respect to the rail to detect the cart passing through the measurement point; and
a notifier electrically connected to the diagnosis processor to notify when the condition of the cart is abnormal; wherein
the for-training partial data are extracted from the measurement data based on a timing at which the position sensor detects the cart;
a correlation between reference data as a basis and measurement data to be extracted is determined while the measurement data are variously offset in a time axis direction; and
the partial data are extracted by cutting out from the measurement data according to a time range defined with reference to the reference data, in a state where the measurement data are offset in the time axis direction so that the correlation is largest.

2. The rail-guided cart system according to claim 1, wherein
the feature extractor is operable to extract a for-diagnosis feature included in for-diagnosis partial data which are partial data corresponding to data when the cart passes through the measurement point, from measurement data measured by the measurement sensor; and
the diagnosis processor is configured or programmed to compute a machine learning evaluation value corresponding to the for-diagnosis feature extracted by the feature extractor based on the learning model trained by the learning controller.

3. The rail-guided cart system according to claim 2, further comprising a for-diagnosis partial data extractor to extract the for-diagnosis partial data from measurement data measured by the measurement sensor.

4. The rail-guided cart system of claim 1, wherein
the rail is suspended from a ceiling of a building or from a trestle installed on a floor; and
the cart is an overhead transport vehicle capable of traveling along the rail.

* * * * *